United States Patent [19]

Coucoulas

[11] 3,959,874

[45] June 1, 1976

[54] METHOD OF FORMING AN INTEGRATED CIRCUIT ASSEMBLY

[75] Inventor: Alexander Coucoulas, Bridgewater Township, Somerset County, N.J.

[73] Assignee: Western Electric Company, Inc., New York, N.Y.

[22] Filed: Dec. 20, 1974

[21] Appl. No.: 534,919

[52] U.S. Cl. ............................. 29/577; 29/578; 29/588; 29/590; 29/628; 174/52 PE; 204/16; 357/72
[51] Int. Cl.² ............................... H01L 21/56
[58] Field of Search ............ 29/577, 578, 588, 589, 29/590, 591, 628; 204/12, 15, 16; 174/52 PE, 52 FP; 357/69, 72, 73

[56] References Cited
UNITED STATES PATENTS

| | | | |
|---|---|---|---|
| 2,874,085 | 2/1959 | Brietzke | 204/12 |
| 3,374,537 | 3/1968 | Doelp, Jr. | 29/627 |
| 3,489,952 | 1/1970 | Hinchey | 174/52 PE |
| 3,612,955 | 10/1971 | Butherus et al. | 29/589 |
| 3,639,215 | 2/1972 | Van Sciver et al. | 204/16 |
| 3,659,035 | 4/1972 | Planzo | 29/588 |
| 3,783,499 | 1/1974 | Hughes, Jr. et al. | 29/590 |
| 3,805,375 | 4/1974 | La Combe et al. | 29/577 |

*Primary Examiner*—Carl E. Hall
*Attorney, Agent, or Firm*—J. Rosenstock

[57] ABSTRACT

A method of forming an integrated circuit assembly is disclosed. The method comprises selectively treating a surface of a carrier to delineate a pattern thereon capable of receiving a metal deposit. The pattern is contacted with a conductive lead of an integrated circuit. The pattern is also contacted with a conductive external element and a metal is then deposited on the pattern to form an assembly having a continuous conductive metal pattern joining the lead and the external element. The resultant metal-deposited assembly may then be encapsulated and removed from the carrier.

54 Claims, 10 Drawing Figures

METHOD OF FORMING AN INTEGRATED CIRCUIT ASSEMBLY

BACKGROUND OF THE INVENTION

1. Field of the Invention

This invention relates to integrated circuits and more particularly, to a method of forming an integrated circuit assembly.

2. Description of the Prior Art

In the manuafacture of electronic circuitry, the use of discrete electrical components, such as resistors, capacitors, and transistors, is rapidly becoming obsolete. These discrete components are largely being supplanted by the integrated circuit, a small chip typically comprising silicon which, by a series of selected masking, etching, and processing steps, can be made to perform all of the functions which may be performed by discrete components when these discrete components are suitably interconnected by conventional or printed wiring to form an operating circuit.

Integrated circuit devices are very small, the dimensions of a typical device being approximately 0.035 × 0.035 inch. These microscopic dimensions permit a heretofore undreamed of degree of miniaturization and significantly improve the operating characteristics of circuits which are fabricated on integrated circuit devices. For example, the switching speed of gating circuits and the bandwidth of I.F. amplifiers, are significantly improved by this miniaturization.

Of course, an integrated circuit cannot operate in vacuo, and must be interconnected with other integrated circuits and to other electrical components such as power supplies, input/output devices, and the like. Here, however, the microscopic dimensions are a distinct disadvantage.

Because of improved manufacturing techniques and increased yield, the cost of integrated circuits has dropped drastically in the last decade and now, in many instances, the cost of packaging or assembling such circuits so that they may be interconnected with other electrical components has become significant and approaches a most undesirable situation.

In one prior art method of packaging integrated circuit devices, each device is bonded to the header of a multiterminal base. Fine gold wires are then hand bonded, one at a time, from the terminal portions of the integrated circuit to corresponding terminal pins on the base, which pins, of course, extend up through the header for this purpose, in a well-known manner. Interconnection of the device with other devices is then made by plugging the base into a conventional socket which is wired to other similar sockets, or to discrete components, by conventional wiring or by printed circuitry.

In another prior art method of packaging integrated circuit devices, a lead frame is first formed by punching or stamping or etching a suitable metallic strip such as a copper strip. The lead frame may then be gold plated to facilitate bonding thereto. A semiconductor chip is then bonded by means of conductive wires to mounting areas provided on the lead frame. The bonded semiconductor chip may then be interconnected to another device by bonding conductive wires thereto. The thus bonded and interconnected chip is then encapsulated.

The use of a lead frame and wire bonding is limited especially as the number of leads to be bonded increases. With increasing connections, processing not only becomes more difficult, but also more expensive. A technique for forming an assembly comprising an integrated circuit chip with beam leads conductively connected to an external lead or terminal without wire bonding is desired.

U.S. Pat. No. 3,325,379 reveals an electroplating method of making metallic patterns having continuous interconnections. However, a method of forming an integrated circuit package which avoids a separate wire bonding step and in which interconnected terminals are formed along with a self-supporting assembly has not heretofore been described.

SUMMARY OF THE INVENTION

This invention relates to integrated circuits and more particularly to a method of forming an integrated circuit assembly.

In a first embodiment, a method of forming an integrated circuit assembly comprises selectively treating a surface of a carrier to delineate a pattern thereon capable of receiving a metal deposit. The pattern is contacted with a conductive lead of an integrated circuit. The contacted pattern is contacted with an external element. A metal is then deposited on the pattern to form an assembly having a continuous conductive metal pattern joining the lead and the external element.

In another embodiment, the metal-deposited assembly is partially encapsulated with an encapsulant to form an encapsulated integrated circuit assembly or package having at least an exposed portion of the external element.

BRIEF DESCRIPTION OF THE DRAWING

The present invention will be more readily understood by reference to the drawing taken in conjunction with the detailed description, wherein.

DETAILED DESCRIPTION

The present invention is described primarily in terms of forming a single integrated circuit assembly or package from an integrated circuit chip having a plurality of conductive elements or leads extending therefrom. However, it will be understood that such description is exemplary only and is for purposes of exposition and not for purposes of limitation. It will be readily appreciated that the inventive concept described is equally applicable to forming a plurality of integrated circuits in a batch process and that each integrated circuit may have one or a plurality of leads extending therefrom.

Figure 1:
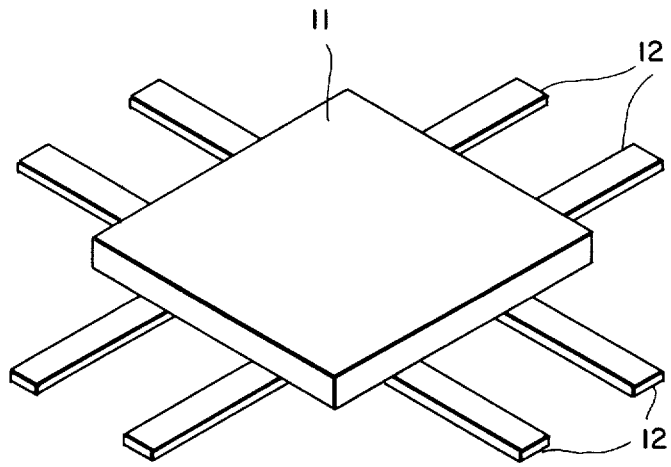
FIG. 1 is an isometric view of a typical integrated circuit having beam leads extending therefrom.
Figure 2:
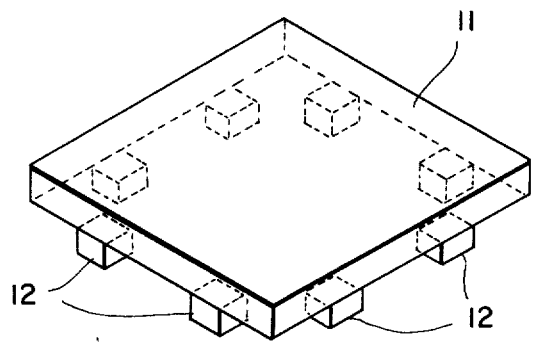
FIG. 2 is an isometric view of an integrated circuit having conductive elements extending therefrom.

Referring to FIG. 1, a typical integrated circuit chip or die 11 is shown. The integrated circuit chip or die 11 can be of a conventional type formed utilizing planar technology in which the chip 11 comprises a suitable semiconductor material such as silicon. The integrated circuit or device is typically formed by diffusing impurities into the silicon to form regions of opposite conductivity type with junctions therebetween extending to the planar active surface of the silicon die. At least one conductive element, lead or extension 12, which extends from the integrated circuit chip 11, makes contact with an active region (not illustrated) of the integrated circuit. The conductive lead 12 extends to or beyond the outer perimeter of the die 11. It is to be noted that the conductive lead 12 extending from the chip 11 may be of any shape or configuration, including conductive bumps as illustrated in FIG. 2.

Figure 3:
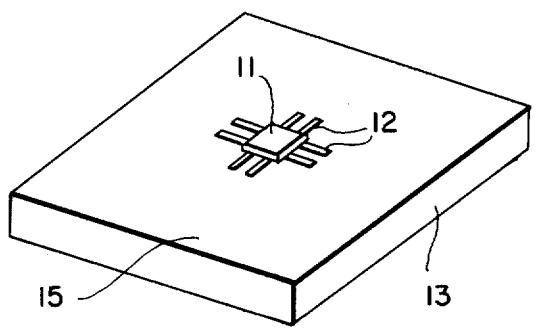
FIG. 3 is an isometric view of the integrated circuit of FIG. 1 on a suitable carrier.

Referring to FIG. 3, the integrated circuit chip 11 is placed on a suitable carrier 13. A suitable carrier 13 comprises any material which is compatible with an electroplating treatment to which the conductive leads 12 are destined to be subjected. In this regard, it is to be pointed out that the carrier 13 may comprise a conductive material, e.g., aluminum, or a non-conductive material, e.g., $Al_2O_3$, or a combination of conductive and non-conductive materials. A preferred carrier is one comprising a magnetic material, e.g., a ferrite such as $BA(Fe_2O_3)$, $Sr(Fe_2O_3)$, etc., which functions to hold the circuit chip 11 through magnetic attraction.

The chip 11 is placed on the carrier 13 and held thereon by any suitable conventional means known in the art. Typically, the chip 11 may be adhesively held on the carrier 13 or the leads 12 of the chip 11 may be cold deformed in such a manner as to provide a relatively secure attachment to the carrier 13, as well as ensuring a continuous metal deposit destined to be deposited on the carrier surface to the leads 12. Preferably, a magnetic carrier, such as a ferrite, which may or may not be electrically conductive, is employed to magnetically hold the chip 11 which has deposited on its inactive surface a magnetic material, e.g., an alloy comprising 30–80% Ni, remainder Fe. A process such as that described in U.S. Pat. No. 3,783,499 assigned to Bell Telephone Laboratories and incorporated hereinto by reference in which semiconductor devices are mounted on a magnetic carrier, may be used to hold the chip 11 as well as for transportation and testing thereof. It is to be noted that preferably, prior to placing the chip 11 on the carrier 13, the carrier 13 is treated with a conventional releasing medium or agent, e.g., $MoSi_2$, which facilitates the removal of the resultant integrated circuit assembly or package therefrom. A preferred releasing medium comprises a metal parting layer (not shown) deposited on the carrier surface using conventional techniques including vapor deposition, electroless plating or electrodeposition when the carrier is conductive. The parting layer should comprise a metal which can be preferentially etched or removed from a metal which is destined to be deposited on the carrier 13, e.g., a parting layer which comprises $Cu^0$ when the carrier 13 is deposited with $Ni^0$. Where the carrier 13 is magnetic, the parting layer should be of a sufficient thickness to function as a parting layer but not so thick as to adversely affect the magnetic coupling between the chip 11 and the carrier 13.

Figure 4:
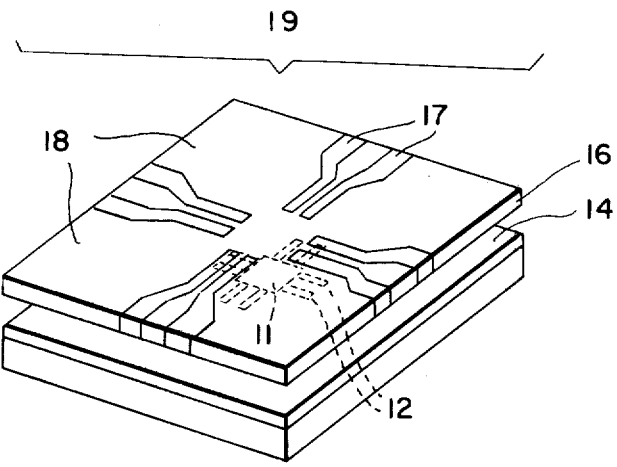
FIG. 4 is an isometric view of the integrated circuit of FIG. 3 having a photoresist coating thereon and a suitable mask adjacent thereto.
Figure 5:
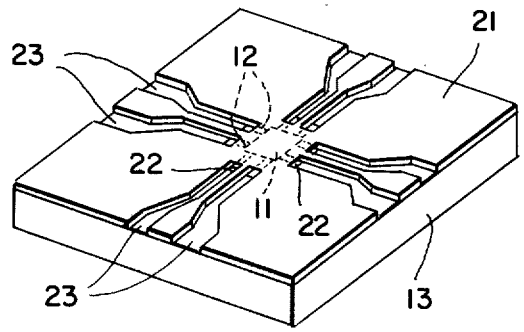
FIG. 5 is an isometric view of the integrated circuit of FIG. 4 having an exposed and developed photoresist coating thereon.

The carrier 13 with the chip 11 held thereon is then treated, e.g., by dipping, spray coating, spin coating, etc., with a conventional electrically insulative photoresist material to form a protective photoresist layer 14 thereon, as shown in FIG. 4. Suitable photoresist materials are well known in the art and may be either positive or negative working. A suitable mask 16, either positive or negative, depending on whether the photoresist is positive or negative, is then placed adjacent to the photoresist layer 14. Suitable masks are well known in the art and typically comprise a radiation transmitting body, e.g., quartz, polyethyleneterephthalate film, etc., having a radiation-opaque pattern thereon.

Where a positive photoresist is employed, the mask 16 has areas 17 which are capable of transmitting therethrough a desired radiation to which the photoresist layer 14 is destined to be exposed. The mask 16 has areas 18 which are incapable of such radiation transmission. Upon exposure to a suitable radiation source 19, e.g., an ultraviolet radiation source, radiation emanating from the source 19, passes through areas 17 of the mask 16 and strike corresponding areas of the positive photoresist layer 14. The areas of the positive photoresist thus exposed become more soluble to a particular solvent than the remaining unexposed areas of the positive photoresist. Referring to FIG. 5, the thus radiation-exposed photoresist layer 14 is then developed, that is, it is treated with the particular solvent, to remove the photoresist material from the exposed areas to delineate (1) a protective photoresist coating or mask 21 on the circuit chip 11 and on areas of the carrier 13, (2) an unprotected or unmasked portion 22 of the conductive lead 12, and (3) an unprotected or unmasked surface pattern 23 on the surface of the carrier 13 which connects or is contiguous to the unprotected portion 22 of the conductive lead 12.

Alternatively, where a negative photoresist is employed, the areas 17 of the mask 16 are incapable of transmitting the radiation therethrough whereas areas 18 are so capable. Upon exposure to the source of radiation 19, the exposed areas of the negative photoresist become less soluble to a particular solvent than the unexposed photoresist areas. Upon development with the particular solvent, the unexposed areas of the resist are removed to form protective coating 21 and the unprotected or exposed portion 22 and pattern 23 (FIG. 5). It is to be noted that the radiation-exposed and developed photoresist material not only forms a protective coating but also serves to more firmly secure the chip 11 to the surface of the carrier 13.

When the carrier 13 does not have a metallic parting layer and comprises an electrically non-conductive material, such as alumina, the pattern 23 is then rendered electrically conductive. The pattern 23 can be rendered conductive using any conventional means such as selective vapor plating, applying conductive inks or lacquers, etc. A standard electroless metal deposition may also be employed using conventional sensitizers, activators and electroless plating solutions. Some such sensitizers, activators, electroless plating solutions and the electroless plating conditions and procedures may be found in *Metallic Coating of Plastics*, william Goldie, Electrochemical Publications, 1968.

Where the carrier 13 comprises an electrically non-conductive ferrite such as $Ba(Fe_2O_3)$, $Sr(Fe_2O_3)$, the pattern 23 does not have to be rendered electrically conductive due to a hitherto undiscovered and as yet unexplained phenomenon exhibited by electrically non-conductive ferrites. Surprisingly and unexpectedly, when a surface comprising an electrically non-conductive ferrite, such as the ferrite $Ba(Fe_2O_3)$ or $Sr(Fe_2O_3)$, is contacted with a cathodically charged conductor in an electroplating bath, there is an electrodeposition on the conductor which spreads and grows onto the ferrite surface and which soon covers the entire ferrite surface. An electrically non-conductive ferrite is one having a resistivity of at least $10^4$ ohm-cm.

Of course, where the carrier 13 comprises an electrically conductive material or has deposited thereon a metal parting layer, the expedient of rendering the surface of the pattern 23 conductive is not necessary.

Figure 6:
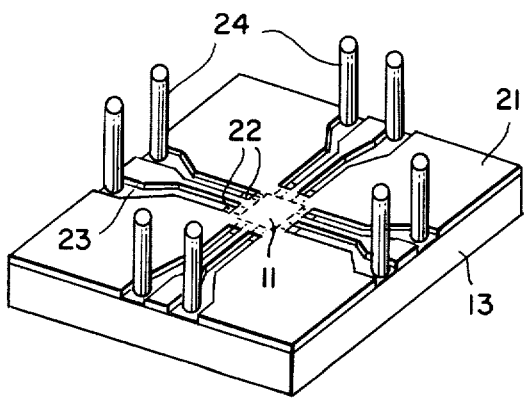
FIG. 6 is an isometric view of the integrated circuit of FIG. 5 which has a conductive external element in contact with a portion of the carrier.
Figure 7:
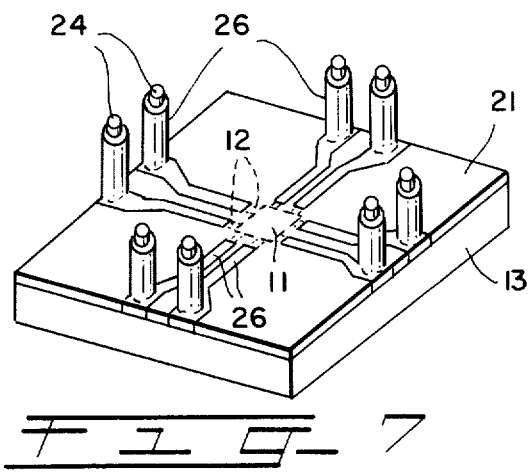
FIG. 7 is an isometric view of the integrated circuit of FIG. 6 which has been subjected to an electrolytic metal deposit.

Referring to FIG. 6, a conductive element or terminal 24 is placed in contact with the surface of the pattern 23, which is or has been rendered capable of receiving an electroplated metal deposit thereon. The conductive element 24 is held in contact with the surface of the pattern 23 by any conventional means (not shown). The conductive element 24 is cathodically charged, as by connection to the negative pole of a DC voltage source (not shown), and the resultant array or assembly is exposed or immersed in a conventional electroplating bath containing a suitable anode, e.g., a nickel anode, which is connected to the positive pole of the DC voltage source (not shown). A suitable current density is maintained in the bath wherein a metal is deposited on the element 24 and on the unprotected surface of the pattern 23 as shown in FIG. 7.

A continuous conductive metal pattern or path 26 is formed which joins the conductive leads 12 and respective external conductive elements 24. Where the carrier 13 comprises an electrically non-conductive ferrite without a conductive layer thereon, the electrodeposited metal is first deposited on the elements 24 and then grows on the unprotected surfaces of the pattern 23. A suitable current density when the carrier comprises a ferrite, such as $Ba(Fe_2O_3)$, and nickel is being electrodeposited, has a typical initial value of about 17 ma/cm² decreasing to a final value of about 10 ma/cm² during plating due to the growth on the ferrite and the increased surface area.

The electrodeposition process forms an electroplated assembly having a continuous conductive metal pattern joining respective leads 12 and elements 24.

In an alternative embodiment, the pattern 23 may be metallized, without recourse to an electroplating treatment, to form the continuous conductive metal deposit 26. Referring to FIG. 7, the conductive element 24 is placed in contact with the surface of pattern 23, which need not be electrically conductive at this stage. The element 24 and the pattern 23 may then be selectively metallized as by selective vapor plating to form the deposit 26. Alternatively, the pattern 23 is selectively sensitized and activated and then the pattern 23 and both lead 12 and element 24 are exposed to an electroless plating solution to form the deposit or conductive pattern 26 to join lead 12 to element 24.

The resultant electroplated or metal-deposited, e.g., electroless-plated, vapor-plated, etc., assembly is then treated to remove or strip the protective photoresist coating 21. The protective coating 21 of photoresist is removed employing any conventional technique such as wet oxidative degradation with either acid or alkaline solutions, dry oxidative degradation with an ambient of an active gas such as ozone or activated oxygen, chemical solvation, abrasion, etc. It is of course understood that the technique employed is one which does not adversely affect or react with either the integrated circuit chip or the resultant conductive leads or elements extending therefrom.

Figure 8:
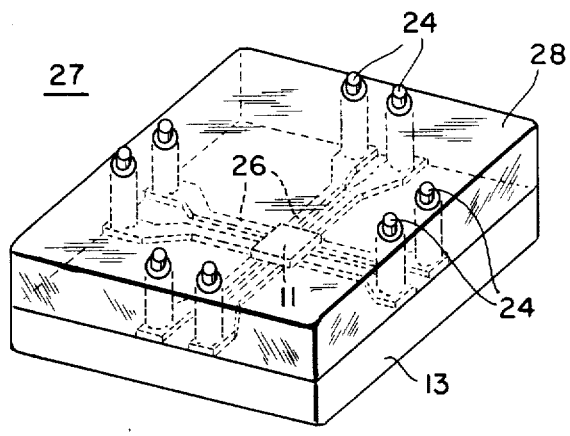
FIG. 8 is an isometric view of the integrated circuit of FIG. 7 which has had the photoresist coating stripped and which has been encapsulated.

Referring to FIG. 8, the resultant photoresist-stripped assembly is treated with a suitable encapsulant in a conventional manner well known to those skilled in the art to form a package or partially encapsulated assembly 27 having an insulative body 28 and at least one external conductive element or terminal 24 having at least a portion thereof unencapsulated or exposed. Some typical suitable encapsulants comprise conventional epoxy formulations, acrylic formulations, phenolics, etc., which are well known to those skilled in the art.

The encapsulated assembly is then removed from the carrier using any conventional means. The use of a release agent or a metal parting layer may facilitate the removal of the encapsulated assembly from the carrier surface 15 (FIG. 3). Where a metallic parting layer is employed, the metal parting layer is selectively removed, as by etching with a suitable etchant which removes the parting layer without adversely affecting or attacking the metal deposit 26. Where deposit 26 comprises nickel, a typical parting layer which may be employed comprises copper. A suitable etchant which will selectively remove the copper without adversely affecting the nickel comprises a mixture comprising 500 ml. of ammonium hydroxide (30% by weight), 100 grams of trichloroacetic acid and 500 ml. of water.

Upon removal from carrier 13, the partially encapsulated assembly is further treated with the encapsulant whereby the assembly surface which had been in contact with the carrier surface is coated or covered therewith. An integrated circuit package is thus formed comprising an insulated body with an interconnected external element or terminal, at least a portion of which is unencapsulated, extending therefrom.

Alternatively, the resultant photoresist-stripped assembly may first be removed from the carrier whereby an unencapsulated, self-supported metal-deposited assembly is obtained. Again, the use of a release agent or metal parting layer may be employed to facilitate this removal. The self-supporting assembly may then be encapsulated to form the integrated circuit package having the insulated body with the at least partially unencapsulated external terminals extending therefrom.

Figure 9:
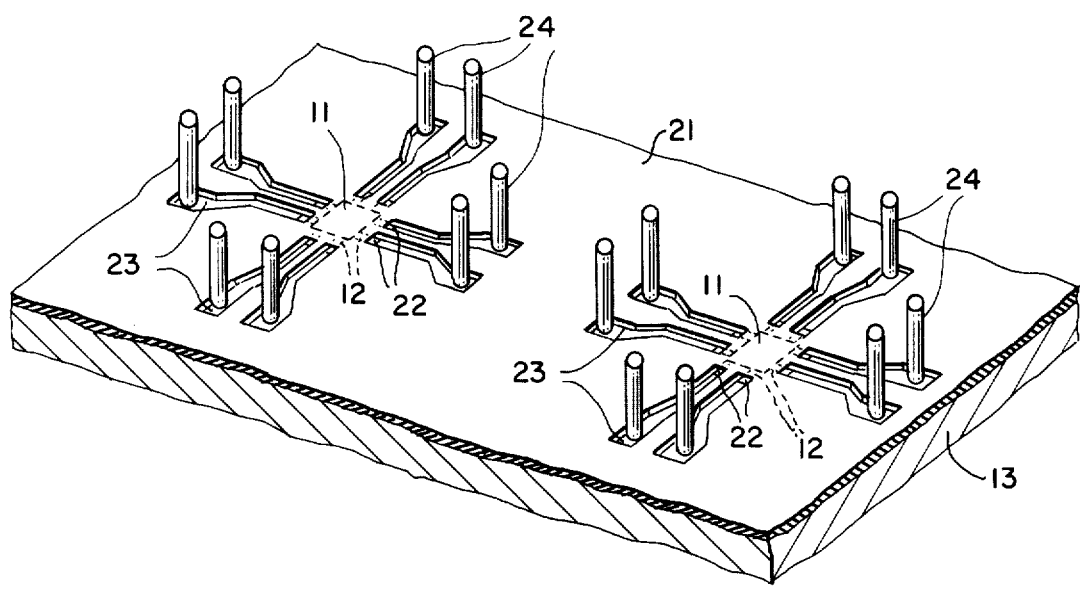
FIG. 9 is a partial isometric view of a plurality of integrated circuits on a carrier having photoresist delineated patterns thereon with which conductive external elements are in contact.

Of course, a plurality of integrated circuit assemblies can be simultaneously formed. Referring to FIG. 9, a plurality of integrated circuits 11 having conductive leads 12 is placed and held on carrier 13. Carrier 13 and chip 11 are treated, as previously described, to form protective photoresist coating 21, a plurality of unprotected portions 22 of leads 12 and a plurality of unprotected surface patterns 23 on the surface of the carrier 13. Conductive elements 24 are placed in contact with the surface of patterns 23 and a metal is deposited on the resultant assembly to form a plurality of continuous conductive metal patterns which include leads 22 conductively joined to their respective elements 24.

The resultant metal-deposited assembly is stripped of photoresists and each integrated circuit is encapsulated. If a metal-parting layer is employed, it is removed and each encapsulated assembly may then be removed from the carrier 13 as previously described.

Of course, where the carrier 13 comprises a magnetized material, e.g., a ferrite, the partially encapsulated assembly, prior to removal therefrom, may be packaged for transportation whereby a cover comprising a magnetic foil is placed thereover. The magnetic foil under the influence of the magnetic field generated from the magnetized carrier then is drawn down to and partially around the assembly in a manner similar to that generally described in U.S. Pat. No. 3,809,233, assigned to the assignee hereof and incorporated by reference hereinto.

EXAMPLE I

An integrated circuit device comprising a silicon chip having 16 beam leads extending therefrom was fabricated with a permalloy magnetic deposit on its back surface or inactive surface. The device was then placed on a ferrite carrier comprising $Ba(Fe_2O_3)$, with the deposited surface of the device facing away from the ferrite surface. The ferrite had been magnetized to hold the device. The extending leads were then cold deformed against the surface of the carrier to further insure adherence of the device to the carrier surface.

A conventional positive photoresist comprising a creosote-formaldehyde resin, commercially obtained, was sprayed over the device and the surrounding ferrite surface. The photoresist was selectively exposed through a positive polyethyleneterephthalate mask to a conventional source of ultraviolet radiation for 12 minutes and then developed with a commercially obtained developer comprising an aqueous mixture of NaOH and methyl ethyl ketone. The unexposed photoresist areas were removed to delineate (1) a photoresist protective coating on the circuit chip and on areas of the carrier, (2) an unprotected portion of each beam lead and (3) an unprotected pattern on the surface of the carrier which extended from the unprotected portion of each beam lead in a manner similar to that shown by FIG. 5. Sixteen copper pins were then each positioned approximately perpendicular to the ferrite surface in contact with the surface of each unprotected pattern in a manner similar to that shown by FIG. 6. A conductive rubber sheet with a back-up plate was then used to force and hold the pins against the ferrite surface. The resultant assembly was then cleaned by immersion for 1 minute in a mild aqua regia solution (1 part by volume concentrated $HNO_3$ [70% by weight], 1 part by volume concentrated HC1 [37% by weight], 12 parts by volume $H_2O$) and then in deionized water for 2 minutes. The assembly was then immersed in a commercially obtained electroplating bath comprising nickel sulfamate $[Ni(NH_2SO_3)_2]$, and containing a nickel anode. The pins were then cathodically charged via the conductive rubber sheet which was not immersed. At an initial current density of 17 ma/cm$^2$, metallic nickel was deposited on the cathodically charged copper pins and then laterally grown from the pins onto the ferrite carrier along the photoresist-delineated unexposed pattern and onto the exposed portion of the beam leads (FIG. 7). After nickel was electroplated to about 0.5 mil in thickness, the plating was discontinued and the remaining photoresist was dissolved in acetone. A commercially obtained, rapidly self-setting resin was then molded (approximately 0.250 inch thick) on the ferrite, nickel plated structure, integrated circuit chip and a portion of the nickel plated copper pins to form, after about 0.5 hour, a cured, partially encapsulated assembly or package (FIG. 8). The partially encapsulated package was then lifted off the ferrite surface and the surface of the package which had been contacting the ferrite surface was treated with the resin to form a cured resin layer thereon of about 125 mils.

EXAMPLE II

Figure 10:
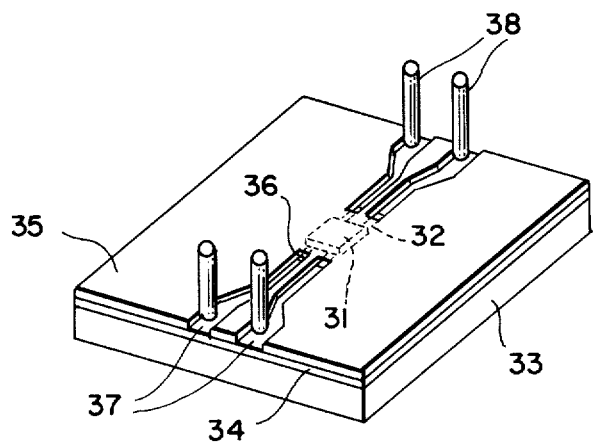
FIG. 10 is an isometric view of an integrated circuit and carrier, having a photoresist coating thereon, with conductive external elements in contact with a portion of the carrier to describe a package configuration having two rows of parallel leads or a dual in-line package configuration.

Referring to FIG. 10, a silicon integrated circuit 31, having sixteen beam leads 32 extending therefrom (for clarity, only 4 leads are described in FIG. 10) was fabricated with a permalloy magnetic deposit on its inactive surface. The circuit 31 was then placed on a ferrite carrier 33 comprising $Ba(Fe_2O_3)$, which had a 0.5 mil copper parting layer 34 thereon. The ferrite had been magnetized to hold the circuit 31 in position. The extending leads were then cold deformed against the copper-coated ferrite.

A conventional positive photoresist comprising a creosote-formaldehyde resin, commercially obtained, was sprayed over the device and the surrounding copper-coated ferrite surface. The photoresist was selectively exposed through a positive polyethyleneterephthalate mask to a conventional source of ultraviolet radiation for 12 minutes and then developed with a commercially obtained developer comprising an aqueous mixture of NaOH and methyl ethyl ketone. The unexposed photoresist areas were removed to delineate (1) a photoresist protective coating 35 on the circuit chip 31 and on areas of the carrier, (2) an unprotected portion 36 of each beam 32 and (3) an unprotected pattern 37 on the surface of the carrier which connected and joined the unprotected portion 36 of each beam 32 to describe a dual in-line packing configuration (a configuration having two rows of parallel leads). Sixteen copper pins 38 (only 4 are illustrated) were then each positioned approximately perpendicular to the ferrite surface in contact with the surface of the unprotected pattern 37. A conductive rubber sheet with a back-up plate (not shown) was then used to force and hold the pins 38 against the surface of the pattern 37. The resultant assembly was then cleaned by immersion for 1 minute in a mild aqua regia solution (1 part by volume concentrated $HNO_3$ [70% by weight], 1 part by volume concentrated HCl [37% by weight], 12 parts by volume $H_2O$), and then in deionized water for 2 minutes. The assembly was then immersed in a commercially obtained electroplating bath comprising nickel sulfamate $[Ni(NH_2SO_3)_2]$, and the pins 38 were cathodically charged via the conductive rubber sheet which was not immersed. At an initial current density of 17 ma/cm$^2$, metallic nickel was deposited on the cathodically charged copper pins 38, on the ferrite carrier 33 along the photoresist-delineated unexposed pattern 37 and on the exposed portion 36 of the beam leads 32. After an electroplated nickel deposit reached a thickness of about 0.5 mil, the plating was discontinued and the remaining photoresist was dissolved in acetone. A commercially obtained epoxy resin was then molded (approximately 0.250 inch thick) on the copper-coated ferrite, nickel-plated structure, integrated circuit chip 31 and a portion of the nickel-plated copper pins 38. After about 16 hours, the partially encapsulated structure or package was lifted off the ferrite surface. The 0.5 mil copper layer 34 was then etched at room temperature and removed from the resultant encapsulated assembly or package with a mixture comprising 500 ml. of ammonium hydroxide (30% by weight), 100 grams trichloroacetic acid and 500 ml. of water. The resultant etched surface was then treated with the encapsulating resin to form a cured resin layer thereon of about 125 mils thereby forming an integrated circuit package having an insulative body and interconnected pins, a portion of which are unencapsulated, extending therefrom.

It is to be understood that the above-described embodiments are simply illustrative of the principles of the invention. Various modifications and changes may be made by those skilled in the art which will embody the principles of the invention and fall within the spirit and scope thereof.

What is claimed is:

1. A method of forming an integrated circuit assembly, which comprises:
   a. selectively treating a surface of a carrier to delineate a pattern thereon capable of receiving a metal deposit;
   b. contacting said pattern with a conductive lead of an integrated circuit;
   c. contacting said contacted pattern with an external conductive element;
   d. depositing a metal on said pattern to form an assembly having a continuous conductive metal deposit joining said lead and said external element;
   e. partially encapsulating said metal-deposited assembly with a suitable encapsulant to form an encapsulated assembly on said carrier having at least a portion of said external element exposed; and
   f. removing said partially encapsulated assembly from said carrier.

2. The method as defined in claim 1 which further comprises providing said carrier surface with a release agent which said conductive lead contacts.

3. The method as defined in claim 1 which further comprises treating said removed assembly with said encapsulant to coat the carrier-contacted surface thereof.

4. A method of forming an integrated circuit assembly, which comprises:
   placing an integrated circuit, having a conductive lead extending therefrom, on a surface of a carrier;
   selectively treating said integrated circuit and said carrier surface to delineate a pattern capable of receiving a metal deposit, said pattern comprising a surface area of said carrier and a portion of said lead contiguous thereto;
   contacting said pattern with an external element;
   depositing a metal on said pattern to form an assembly having a continuous conductive metal deposit joining said lead and said external element;
   partially encapsulating said metal-deposited assembly with a suitable encapsulant to form an encapsulated assembly on said carrier having at least a portion of said external element exposed; and
   removing said partially encapsulated assembly from said carrier.

5. The method as defined in claim 4 which further comprises:
   treating said surface of said carrier with a release agent prior to placing said integrated circuit on said treated surface.

6. The method as defined in claim 5 wherein said release agent treatment comprises providing said carrier with a parting layer.

7. The method as defined in claim 4 which further comprises:
   treating said removed assembly with said encapsulant to coat the carrier-contacted surface thereof.

8. A method of forming an integrated circuit assembly, which comprises:
   a. placing an integrated circuit, having a conductive lead extending therefrom, on a carrier;
   b. selectively treating said integrated circuit and said carrier to delineate a surface pattern thereon capable of receiving an electroplated metal deposit, said pattern comprising a surface area of said carrier and a portion of said lead contiguous thereto;
   c. contacting said pattern with a cathodically charged external element;
   d. exposing said contacted pattern to an electroplating solution to deposit a metal thereon to form an assembly having a continuous conductive metal deposit joining said lead and said external element;
   e. partially encapsulating said metal-deposited assembly with a suitable encapsulant to form an encapsulated assembly on said carrier having at least a portion of said external element exposed; and
   f. removing said partially encapsulated assembly from said carrier.

9. The method as defined in claim 8 which further comprises:
   treating the surface of said carrier with a release agent prior to placing said integrated circuit on said treated surface.

10. The method as defined in claim 9 wherein said release agent treatment comprises providing said carrier with a parting layer.

11. The mehtod as defined in claim 8 which further comprises:
    treating said removed assembly with said encapsulant to coat the carrier-contacted surface thereof.

12. The method as defined in claim 8 wherein said carrier comprises a ferrite.

13. The method as defined in claim 8 wherein said carrier comprises a ferrite selected from the group consisting of $Ba(Fe_2O_3)$ and $Sr(Fe_2O_3)$.

14. A method of forming an integrated circuit package, which comprises:
    a. placing an integrated circuit, having a conductive lead extending therefrom, on a surface of a carrier;
    b. selectively treating said integrated circuit and said carrier surface to form a protective mask thereon delineating an unmasked portion of said lead and an unmasked pattern on said carrier surface capable of receiving an electroplated metal deposit, said unmasked pattern merging with said unmasked portion;
    c. contacting said pattern with a cathodically charged element;
    d. immersing said contacted pattern in an electroplating solution to electrodeposit a metal thereon to join said cathodically charged element to said portion to form an assembly;
    e. partially encapsulating said metal-deposited assembly with a suitable encapsulant to form a partially encapsulated assembly; and f. removing said partially encapsulated assembly from said carrier.

15. The method as defined in claim 14 which further comprises:
    treating a surface of said carrier with a release agent prior to placing said integrated circuit on said treated surface.

16. The method as defined in claim 15 wherein said release agent treatment comprises providing said carrier with a parting layer.

17. The method as defined in claim 15 which further comprises:
    treating said removed assembly with said encapsulant to coat the carrier-contacted surface thereof.

18. The method as defined in claim 14 wherein said carrier comprises an iron oxide.

19. The method as defined in claim 14 wherein said carrier comprises a ferrite selected from the group consisting of $Ba(Fe_2O_3)$ and $Sr(Fe_2O_3)$.

20. In a method for joining an electrical connection to a lead of an integrated circuit device, which comprises electrically interconnecting a portion of the lead with an external electrical connection, wherein the improvement comprises:
    prior to said electrical interconnecting step, contacting the device with a surface of an electrically nonconductive carrier comprising an electrically nonconductive ferrite containing material;
    coating said contacted device and said carrier surface with an electrically insulating material to form an exposed pattern comprising an exposed portion of the lead and an exposed area of said carrier surface contiguous thereto;
    contacting said exposed pattern with a cathodically charged electrical element; and
    in said electrical interconnecting step, subjecting said contacted pattern and electrical element to an electrodeposition to deposit a metal thereon to electrically join the lead to the electrical element.

21. The method as defined in claim 20 wherein said carrier surface comprises a ferrite selected from the group consisting of $Ba(Fe_2O_3)$ and $Sr(Fe_2O_3)$.

22. A method of forming an integrated circuit package, which comprises:
    a. placing an integrated circuit, having a plurality of conductive leads extending therefrom, on a carrier;
    b. selectively treating said integrated circuit and said carrier to form a protective mask thereon delineating a plurality of unmasked patterns capable of receiving a metal deposit, each unmasked pattern including an unmasked portion of at least one lead and an unmasked surface area of said carrier contiguous to said unmasked portion;
    c. contacting each of said patterns with a conductive element;
    d. depositing a metal on each of said patterns to form a plurality of conductive metal deposits, each including said element conductively connected to said portion, to form a metal-deposited assembly;
    e. partially encapsulating said metal-deposited assembly with a suitable encapsulant to form a partially encapsulated assembly; and
    f. removing said assembly from said carrier.

23. The method as defined in claim 22 which further comprises:
    treating a surface of said carrier with a release agent prior to placing said integrated circuit on said treated surface.

24. The method as defined in claim 23 wherein said release agent treatment comprises providing said carrier with a parting layer.

25. The method as defined in claim 22 which further comprises:
    treating said removed assembly with said encapsulant to coat the carrier-contacted surface thereof.

26. The method as defined in claim 22 wherein said carrier comprises a ferrite.

27. The method as defined in claim 22 wherein said carrier comprises a ferrite selected from the group consisting of $Ba(Fe_2O_3)$ and $Sr(Fe_2O_3)$.

28. The method as defined in claim 22 wherein:
    in step (b), selectively treating to delineate a plurality of unmasked patterns capable of receiving an electroplated metal deposit;
    in step (c), cathodically charging said contacting element; and
    in step (d), electrolytically treating each of said patterns to electrodeposit said metal thereon.

29. A method of forming a plurality of integrated circuit packages, which comprises:
    a. placing a plurality of integrated circuits, each having at least one lead extending therefrom, on a carrier;
    b. selectively treating said plurality of integrated circuits and said carrier to delineate at least one surface pattern on said carrier capable of receiving a metal deposit, said pattern comprising at least one surface area of said carrier and a portion of at least one lead contiguous thereto;
    c. contacting said at least one pattern with at least one conductive element;
    d. depositing a metal on said at least one pattern to form an assembly having a conductive metal deposit comprising said at least one element conductively joined to said portion;
    e. partially encapsulating said metal-deposited assembly with a suitable encapsulant to form a partially encapsulated assembly; and
    f. removing said assembly from said carrier.

30. The method as defined in claim 29 which further comprises:
    treating a surface of said carrier with a release agent prior to placing said plurality of integrated circuits on said treated surface.

31. The method as defined in claim 30 wherein said release agent treatment comprises providing said carrier with a parting layer.

32. The method as defined in claim 29 which further comprises:
    treating said removed assembly with said encapsulant to coat the carrier-contacted surface thereof.

33. The method as defined in claim 29 wherein said carrier comprises a ferrite.

34. The method as defined in claim 29 wherein said carrier comprises a ferrite selected from the group consisting of $Ba(Fe_2O_3)$ and $Sr(Fe_2O_3)$.

35. The method as defined in claim 29 wherein:
    in step (b), selectively treating to delineate at least one pattern capable of receiving an electroplated metal deposit;
    in step (c), cathodically charging said contacting element; and
    in step (d), electrolytically treating said at least one pattern to electrodeposit said metal thereon.

36. A method of forming an integrated circuit assembly, which comprises:

a. selectively masking a surface of an electrically non-conductive carrier comprising an electrically non-conductive ferrite to delineate an unmasked pattern capable of receiving an electroplated metal deposit;

b. contacting said unmasked pattern with a conductive lead of an integrated circuit; and c. electrodepositing a metal deposit on said unmasked pattern to form an assembly having a continuous conductive metal pattern comprising said lead.

37. The method as defined in claim 36 which further comprises:

partially encapsulating said metal-deposited assembly with a suitable encapsulant to form an encapsulated assembly on said carrier having at least a portion of said external lead exposed.

38. The method as defined in claim 37 which further comprises removing said partially encapsulated assembly from said carrier.

39. The method as defined in claim 38 which further comprises providing said carrier surface with a release agent which said conductive lead contacts.

40. The method as defined in claim 38 which further comprises:

treating said removed assembly with said encapsulant to coat the carrier-contacted surface thereof.

41. A method of forming an integrated circuit assembly, which comprises:

a. placing an integrated circuit, having a conductive lead extending therefrom on an electrically non-conductive surface comprising an electrically non-conductive ferrite;

b. selectively masking said integrated circuit and said surface to delineate an unmasked pattern capable of receiving an electroplated metal deposit, said pattern comprising an area of said surface and a portion of said lead contiguous thereto;

c. contacting said pattern with a cathodically charged external element; and d. exposing said contacted pattern to an electroplating solution to electrodeposit a metal thereon to form an assembly having a continuous conductive metal deposit joining said lead and said external element.

42. The method as defined in claim 41 which further comprises:

partially encapsulating said metal-deposited assembly with a suitable encapsulant to form an encapsulated assembly on said surface having at least a portion of said external element exposed.

43. The method as defined in claim 42 which further comprises:

removing said partially encapsulated assembly from said surface.

44. The method as defined in claim 43 which further comprises:

treating said surface with a release agent prior to placing said integrated circuit on said treated surface.

45. The method as defined in claim 44 wherein said release agent treatment comprises providing said surface with a parting layer.

46. The method as defined in claim 43 which further comprises:

treating said removed assembly with said encapsulant to coat the carrier-contacted surface thereof.

47. The method as defined in claim 41 wherein said surface comprises a ferrite selected from the group consisting of $Ba(Fe_2O_3)$ and $Sr(Fe_2O_3)$.

48. A method of processing an integrated circuit having a beam lead extending therefrom, which comprises:

depositing a layer of a magnetic material on the inactive side of the integrated circuit;

placing the active side of the deposited integrated circuit on a surface of an electrically non-conductive, magnetized carrier comprising an electrically non-conductive ferrite to hold the integrated circuit;

masking said integrated circuit and said carrier surface to delineate a pattern capable of receiving an electroplated metal deposit, said pattern comprising an area of said carrier surface and a portion of the lead contiguous thereto;

contacting said pattern with a cathodically charged terminal pin; and exposing said contacted pattern to an electroplating solution to electrodeposit a metal thereon to form an assembly having a continuous conductive metal deposit joining the lead and said terminal.

49. The method as defined in claim 48 which further comprises:

partially encapsulating said metal-deposited assembly with a suitable encapsulant to form an assembly having at least a portion of said terminal exposed.

50. The method as defined in claim 49 which further comprises:

removing said partially encapsulated assembly from said surface.

51. The method as defined in claim 50 which further comprises:

treating said surface with a release agent prior to placing said integrated circuit on said treated surface.

52. The method as defined in claim 51 wherein said release agent treatment comprises providing said surface with a parting layer.

53. The method as defined in claim 50 which further comprises:

treating said removed assembly with said encapsulant to coat the carrier-contacted surface thereof.

54. The method as defined in claim 48 which further comprises:

placing a magnetic foil over the metal-deposited assembly, said foil being coextensive with said magnetized carrier and drawn towards said carrier to engage said assembly.

* * * * *